United States Patent
Li et al.

(10) Patent No.: US 6,251,784 B1
(45) Date of Patent: Jun. 26, 2001

(54) REAL-TIME CONTROL OF CHEMICAL-MECHANICAL POLISHING PROCESSING BY MONITORING IONIZATION CURRENT

(75) Inventors: Leping Li, Poughkeepsie, NY (US); James Albert Gilhooly, Saint Albans; Clifford Owen Morgan, Burlington, both of VT (US); Cong Wei, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/206,892

(22) Filed: Dec. 8, 1998

(51) Int. Cl.[7] ................................................ H01L 21/302

(52) U.S. Cl. .............................. 438/692; 438/7; 438/10; 438/706; 216/88; 216/85; 216/86; 216/60; 216/61

(58) Field of Search .......................... 216/88, 85, 86, 216/60, 61; 438/692, 7, 8, 9, 10, 11, 706

(56) References Cited

U.S. PATENT DOCUMENTS

| | | | |
|---|---|---|---|
| 3,503,711 | 3/1970 | Skala | 23/232 |
| 3,904,371 | 9/1975 | Neti et al. | 23/232 |
| 4,493,745 | 1/1985 | Chen et al. | 156/626 |
| 4,512,964 | 4/1985 | Vayenas | 423/403 |
| 4,812,416 | 3/1989 | Hewig et al. | 437/5 |
| 4,961,834 | 10/1990 | Kuhn et al. | 204/412 |
| 4,975,141 | 12/1990 | Greco et al. | 156/626 |
| 5,234,567 | 8/1993 | Hobbs et al. | 204/415 |
| 5,242,532 | 9/1993 | Cain | 156/626 |
| 5,242,882 | 9/1993 | Campbell | 502/325 |
| 5,256,387 | 10/1993 | Campbell | 423/392 |
| 5,395,589 | 3/1995 | Nacson | 422/88 |
| 5,399,234 | 3/1995 | Yu et al. | 156/636 |
| 5,405,488 | 4/1995 | Dimitrelis et al. | 156/627 |
| 5,439,551 | 8/1995 | Meikle et al. | 156/626 |
| 5,559,428 | 9/1996 | Li et al. | 324/71.5 |
| 6,066,564 | * 5/2000 | Li et al. | 438/692 |

FOREIGN PATENT DOCUMENTS

| | | |
|---|---|---|
| 3277947 | 12/1991 | (JP) . |
| 10-242089 | * 9/1998 | (JP) . |
| 11-145091 | * 5/1999 | (JP) . |

OTHER PUBLICATIONS

"Principles of Instrumental Analysis"; Skoog et. al.; ©1980; Saunders College.*

Park, et al, "Real Time Monitoring of NH, Concentration Using Diffusion Scrubber Sampling Technique and Result of Application to the Processing of Chemically Amplified Resists" Jpn. J. Appl. Phys. vol. 34 (1995) pp. 6770–6773 Part 1 No. 12B, Dec., 1995.

(List continued on next page.)

Primary Examiner—Gregory Mills
Assistant Examiner—George Goudreau
(74) Attorney, Agent, or Firm—Jay H. Anderson

(57) ABSTRACT

A method and apparatus are described for detecting an endpoint of a film removal process in which a target film overlying a stopping film is removed. A chemical reaction product is generated from at least one of the target film and the stopping film; this chemical reaction product is converted to a separate product. The separate product is exposed to ionizing radiation. The ionization current generated by the radiation is monitored as the target film is removed. A change in the ionization current corresponds to a change in concentration of the separate product, thereby indicating the endpoint of the film removal process. In the particular case of removal of a silicon dioxide film overlying a silicon nitride film by chemical-mechanical polishing, the reaction product is ammonia extracted from the polishing slurry. The ammonia is converted to ammonium chloride by a reaction with hydrogen chloride vapor. As the ammonium chloride, entrained in a carrier gas, is pumped through a detection unit, a change in the concentration thereof is detected by monitoring a change in the ionization current generated by a source of alpha particles.

19 Claims, 4 Drawing Sheets

OTHER PUBLICATIONS

Carr, et al, Technical Disclosure Bulletin, "End–Point Detection of Chemical/Mechanical Polishing of Circuitized Multilayer Substrates", YO887–0456, vol. 34 No. 4B, Sep. 1991 p. 406–407.

Carr, et al, Technical Disclosure Bulletin, "End–Point Detection of Chemical/Mechanical Polishing of Thin Film Structures". YO886–0830, vol. 34 No. 4A, Sep. 1991, p. 198–200.

Biolsi, et al, "An Advanced Endpoint Detection Solution for <1% Open Areas", Solid State Technology, Dec. 1996, p. 59–67.

Economou, et al, "In Situ Monitoring of Etching Uniformity in Plasma Reactors", Solid State Technology, Apr., 1991, p. 107–111.

Roland, et al, "Endpoint Detecting in Plasma Etching", J. Vac. Sci. Technol. A3(3), May/Jun. 1985, p. 631–636.

Rutten, Research Disclosure, Endpoint Detection Method for Ion Etching of Material Having a Titanium Nitride Underlayer, BU890–0132, Feb. 1991, No. 322, Kenneth Mason Publications Ltd, England.

* cited by examiner

REAL-TIME CONTROL OF CHEMICAL-MECHANICAL POLISHING PROCESSING BY MONITORING IONIZATION CURRENT This application is related to application Ser. Nos. 09/073,601, 09/073,602, 09/073,603, 09/073,604, 09/073,605, 09/073,606 and 09/073,607, all filed May 6, 1998; and to application Ser. Nos. 09/129,003, 09/129,102, 09/129,103, 09/129,104 and 09/129,107, all filed Aug. 4, 1998. All of these related applications are assigned to the same assignee as the present application. The disclosures of all these related applications are incorporated herein by reference.

FIELD OF THE INVENTION

This invention relates to semiconductor processing, and more particularly to detection of the endpoint for removal of one film overlying another film.

BACKGROUND OF THE INVENTION

In the semiconductor industry, critical steps in the production of integrated circuits are the selective formation and removal of films on an underlying substrate. Typical processing steps involve (1) depositing a film; (2) patterning areas of the film using lithography and etching; (3) depositing a film which fills the etched areas; and (4) planarizing the structure by etching or chemical-mechanical polishing (CMP).

In film removal processes, it is extremely important to stop the process when the correct film thickness has been removed (that is, when the endpoint has been reached). In a typical CMP process, a film is selectively removed from a semiconductor wafer by moving the wafer, in a rotating or linear motion, against a polishing pad (or moving the pad against the wafer, or both) with a controlled amount of pressure in the presence of a slurry. Overpolishing (removing too much) of a film renders the wafer unusable for further processing, thereby resulting in yield loss. Underpolishing (removing too little) of the film requires that the CMP process be repeated, which is tedious and costly.

A number of methods have been suggested for obtaining reliable endpoint detection in CMP processing. These involve the following types of measurement: (1) timing the process; (2) friction or motor current; (3) capacitive; (4) optical; (5) acoustical; and (6) inductive.

In addition, U.S. Pat. No. 5,399,234 to Yu et al. describes monitoring the CMP endpoint by sending acoustic waves through a slurry containing potassium hydroxide. A chemical reaction between the potassium hydroxide and the layer being polished yields a reaction product whose concentration decreases as the endpoint is reached; this decrease is associated with a change in the acoustic velocity.

These endpoint detection methods each have inherent disadvantages, such as a lack of sensitivity, an inability to provide real-time monitoring, or requiring removal of the wafer from the process apparatus to test for endpoint.

U.S. Pat. No. 5,559,428 to Li et al. describes an in-situ endpoint detection scheme for conductive films, using an induction method. There remains a need for an in-situ, real-time endpoint detection scheme suitable for use with non-conductive films. Such a scheme should also have high detection sensitivity and fast response time (preferably less than 1 second). In addition, it is desirable that the detection apparatus be robust, inexpensive and require little maintenance.

A particularly crucial application of endpoint detection in CMP processing involves removal of a silicon dioxide ($SiO_2$) film overlying a silicon nitride ($Si_3N_4$) film. FIG. 1A shows a typical CMP apparatus 10 in which a workpiece 100 (such as a silicon wafer) is held face down by a wafer carrier 11 and polished using a polishing pad 12 located on a polishing table 13. FIG. 1B is a detail view showing a thin layer 102 of nitride with an overlying layer 104 of oxide. Generally, it is necessary to remove the target film of oxide so as to completely expose the stopping film of nitride, while leaving the stopping film essentially intact (see FIG. 1C). An additional requirement is that, when the process endpoint is reached, the distance between the silicon/nitride interface 107 and the surface 105 of the oxide be controlled within ±200 Å of the target distance. This is referred to in the art as a target window of ±200 Å. Since the oxide removal rate is typically 50 Å/sec, the process time must be controlled to within ±4 sec. Accordingly, a successful endpoint detection scheme must detect exposure of the nitride layer with very high sensitivity, and automatically stop the CMP process within a few seconds after the nitride becomes exposed (that is, no operator intervention should be required when endpoint is reached). Furthermore, the endpoint detection scheme should be effective regardless of the pattern factor of the wafer (that is, even if the area of the exposed underlying layer is a small portion of the total wafer area).

SUMMARY OF THE INVENTION

The present invention addresses the above-described need for endpoint detection and control of a film removal process by providing a reliable, real-time, in-situ method of endpoint detection.

The present invention will be described with reference to chemical-mechanical polishing merely as a specific example, and is not meant to limit applicability of the invention to semiconductor processing technology. Those skilled in the art will appreciate that the invention is broadly applicable to any process in which it is desirable to detect the endpoint for removal of a target film overlying a stopping film. In accordance with the present invention, this is done by removing the target film with a process that generates a chemical reaction product from the target film or the stopping film (or from both films, but at different levels of concentration); converting the chemical reaction product into a separate product; exposing the separate product to ionizing radiation (for example, alpha particles); and monitoring the ionization current generated by the radiation as the target film is being removed. A change in the current indicates a change in the concentration of the separate product, and therefore in the concentration of the chemical reaction product. This change can be correlated to the process endpoint, thereby providing real-time, in-situ monitoring capability and process control.

More specifically, the endpoint detection method of the present invention may be used with a dry etching process or a CMP process. When the method is used with a CMP process, the chemical reaction product may be extracted as a gas from the polishing slurry. In particular, the slurry may be brought into contact with one side of a membrane which is hydrophobic but permeable to the gas molecules. A carrier gas stream below atmospheric pressure contacts the other side of the hydrophobic membrane, so that the chemical reaction product is pulled through the membrane, is entrained in the gas stream and subsequently is introduced into the detection unit.

The endpoint detection method of the present invention may include a step of stopping the film removal process when the endpoint has been reached, thereby providing automatic control of the film removal process.

According to another aspect of the invention, an apparatus for detecting the endpoint of a film removal process is provided, including: a converter for converting the chemical reaction product to a separate, easily detectable product; means for exposing the separate product to ionizing radiation; and a monitor for monitoring an ionization current generated by the radiation as the target film is removed. The apparatus may also include means for stopping the film removal process when the endpoint has been reached. The apparatus may also include an extractor for extracting the chemical reaction product as a gas from a polishing slurry, when the film removal process is chemical-mechanical polishing.

DETAILED DESCRIPTION OF THE PREFERRED EMBODIMENTS

Details of the present invention will be discussed with reference to removal of a silicon dioxide film overlying a silicon nitride film.

Figure 1A:
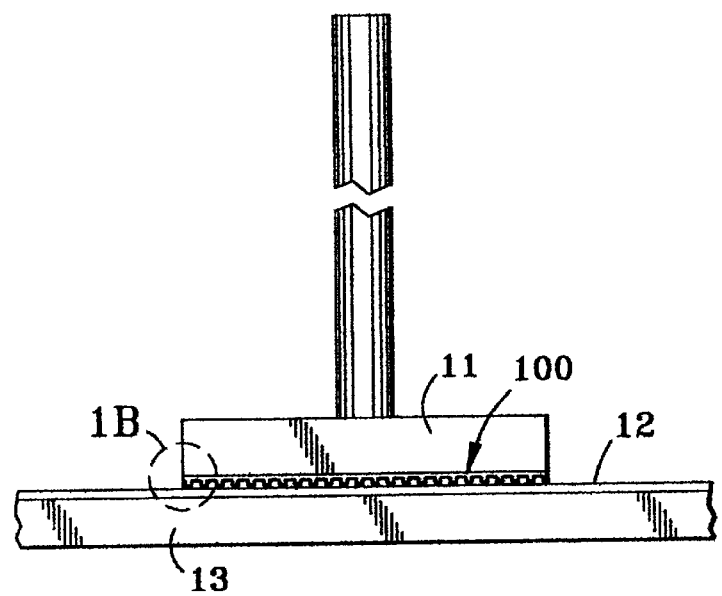
FIG. 1A is a general view of a typical chemical-mechanical polishing (CMP) arrangement to which the present invention may be advantageously applied.
Figure 1B:
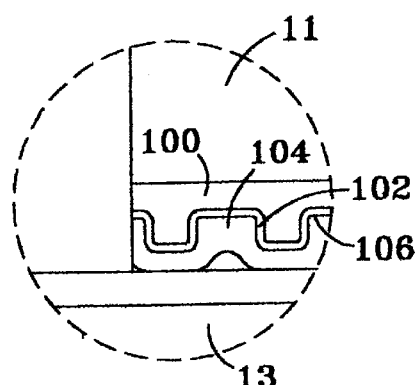
FIG. 1B is a detail view showing an arrangement of silicon dioxide and silicon nitride films where film removal by CMP is to be performed.
Figure 1C:
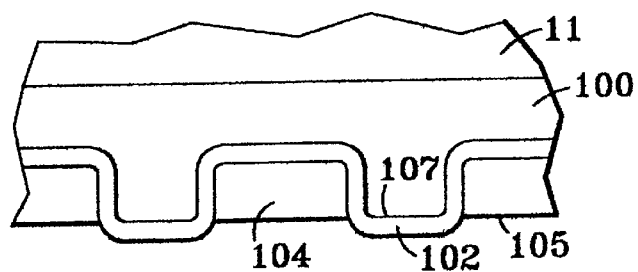
FIG. 1C shows a desired result of CMP processing of the film arrangement of FIG. 1B.

Referring to FIG. 1A, it has recently been found that when CMP is performed on a substrate 100 with a target film of oxide ($SiO_2$) 104 over a stopping film of nitride ($Si_3N_4$) 102 using a slurry containing water and fumed silica and having a pH of about 10.5, a chemical reaction occurs when the interface 106 is reached, resulting in the production of ammonia ($NH_3$).

When oxide is polished with a slurry which is a mixture of fumed silica, water and potassium hydroxide (KOH), the slurry having a pH of about 10.5, the following reaction occurs:

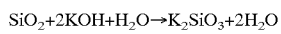

When nitride is polished, the following reaction occurs:

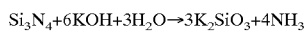

The ammonia produced is dissolved in the slurry, and because of the relatively high pH it exists primarily in the form of $NH_3$ rather than $NH_4^+$. Accordingly, a change in the level of ammonia in the slurry indicates a change in the degree of exposure of the underlying nitride film; accordingly, the endpoint for removal of the oxide film can be determined by monitoring the level of ammonia in the slurry. When this endpoint is reached, the polishing process may be stopped.

More generally, the endpoint for removal of any non-nitride-containing film overlying a nitride-containing film can be detected by monitoring the level of ammonia in the slurry. Conversely, the endpoint for removal of a nitride-containing film can also be detected in a similar manner; in this case, a marked decrease in the presence of ammonia would indicate the endpoint.

Still more generally, the endpoint for removal of any film overlying another film can be detected by monitoring the level of a chemical reaction product in the slurry, as a component of the slurry reacts selectively with one of the films (either the overlying or underlying film).

It should also be noted that the endpoint for removal of a film overlying another film can be detected even if the films are the same type, provided that a reaction with the slurry yields a chemical reaction product with different concentrations from the two films. For example, a nitride contaminant in an oxide layer will react with the slurry to form ammonia. If two oxide layers have different nitride concentrations, the concentrations of ammonia reaction product will be different. This difference in concentration may be detected and used to determine the endpoint for removal of one oxide layer overlying the other oxide layer.

The specific example of ammonia as a reaction product will be discussed in detail; the scope of the invention is not intended to be limited to that particular embodiment.

In order to implement ammonia production in the slurry as part of an endpoint detection scheme suitable for use in manufacturing, real-time and in-situ slurry collection and sampling are required. Preferably, the collection and sampling provide a rapid response with high sensitivity to ammonia, and minimize the effect of interference from other substances in the slurry and in the surrounding air.

Figure 2:
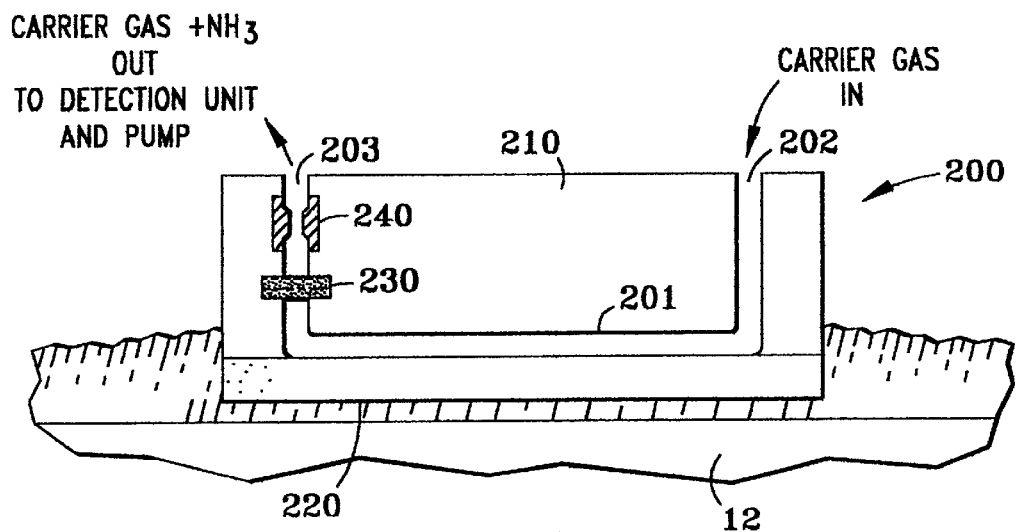
FIG. 2 shows details of an ammonia extraction unit for extracting ammonia from the slurry during polishing.

In order to detect the endpoint of a CMP process by monitoring the concentration of ammonia produced during polishing, the ammonia must first be extracted from the slurry. This may be accomplished using an ammonia extraction unit 200, as shown in FIG. 2 The extraction unit 200 has a body 210 (for example, a plastic block) with a channel 201 formed therein. The channel 201 is connected to a source (not shown) of a clean, dry carrier gas (e.g. conditioned air) through an inlet connector 202. The channel 201 is also connected through an outlet connector 203 to a detection unit (not shown). The bottom of the unit is covered by a hydrophobic, gas permeable membrane 220. The channel 201 thus comprises a gas flow path with a gas-permeable membrane running along a portion of its length. The carrier gas pressure in channel 201 is maintained below atmospheric pressure. The extraction unit is placed in contact with the slurry on top of the polishing pad 12. Ammonia dissolved in the slurry penetrates the gas-permeable membrane 220 and enters the gas stream due to the pressure difference across the membrane. The contact between the extraction unit and the slurry, and between the slurry and the surface of the polishing pad, serves to prevent atmospheric air from entering the gas stream. An additional membrane 230 is placed in the gas stream to prevent slurry from reaching the detection unit in the event the membrane 220 is damaged and slurry thereby enters the channel 201. The dry carrier gas, with the ammonia reaction product entrained therein, is pumped out through a flow restriction device 240.

Figure 3:
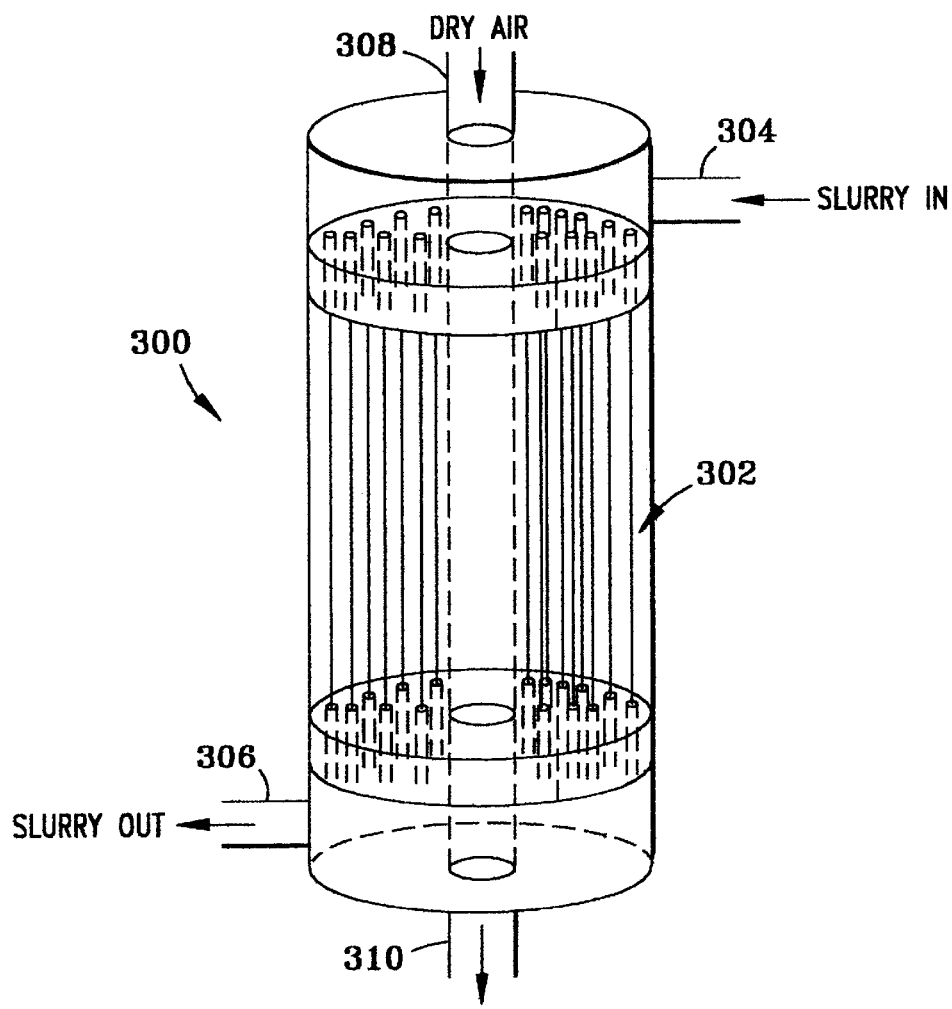
FIG. 3 shows details of an another ammonia extraction unit for extracting ammonia from the slurry during polishing.

An alternate arrangement for an ammonia extraction unit is shown in FIG. 3. The extraction unit 300 may be constructed from polypropylene microporous hollow fibers 302 obtained from a dismantled Liqui-Cel contactor (Hoechst Celanese, model 2.5×8). Fibers 302 allow gas but not liquid to pass from the outside to the inside of the fibers.

Slurry is pumped into the extraction unit through inlet 304, on the outside of fibers 302, and exits the extraction unit through outlet 306. A clean, dry carrier gas (e.g. conditioned air) is pumped into the extraction unit through inlet 308 through the inside of the fibers and exits through outlet 310, carrying the ammonia gas molecules. Alternatively, the slurry and carrier gas may be pumped along the outside and inside, respectively, of a hydrophobic gas-permeable membrane. The carrier gas may be pumped through a drier (not shown) containing an ammonia filter before entering extraction unit 300. The carrier gas is pumped at a reduced pressure of approximately 30 Torr to facilitate ammonia transport from the slurry through the fibers and into the gas stream. The reduced pressure also increases the overall flow velocity, thereby reducing the response time for measuring the change in ammonia concentration.

The ammonia-containing gas sample stream can then be analyzed and monitored to detect the endpoint of the film removal process.

Figure 4A:
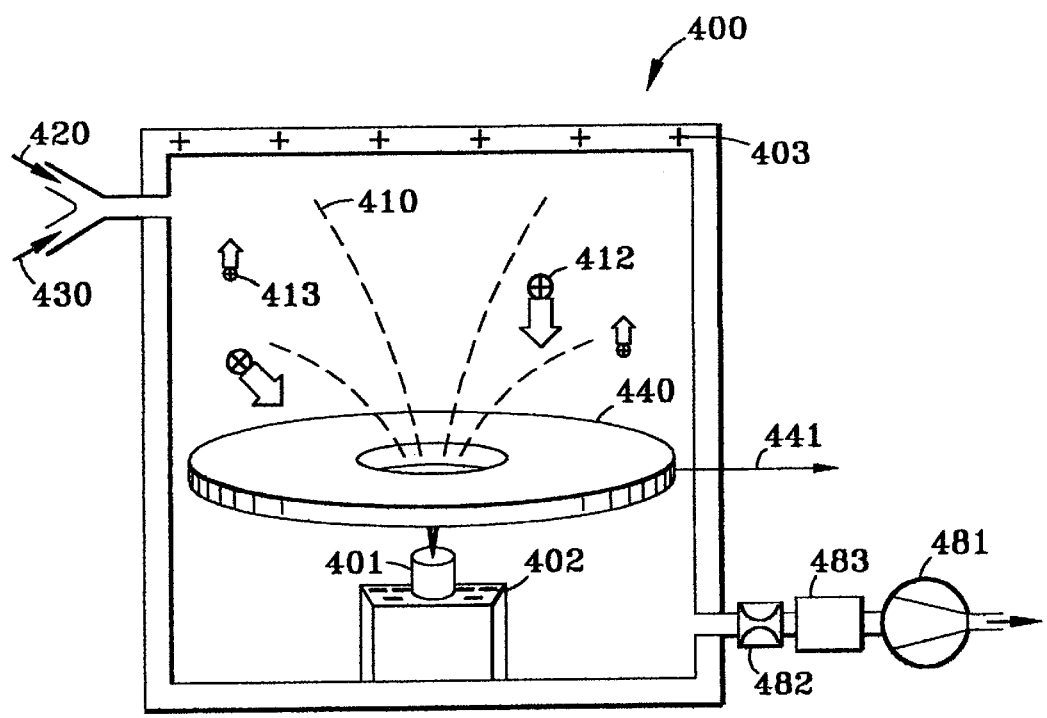
FIG. 4A shows details of a detection unit and its operation when no ammonia is present in the gas stream from the ammonia extraction unit.
Figure 4B:
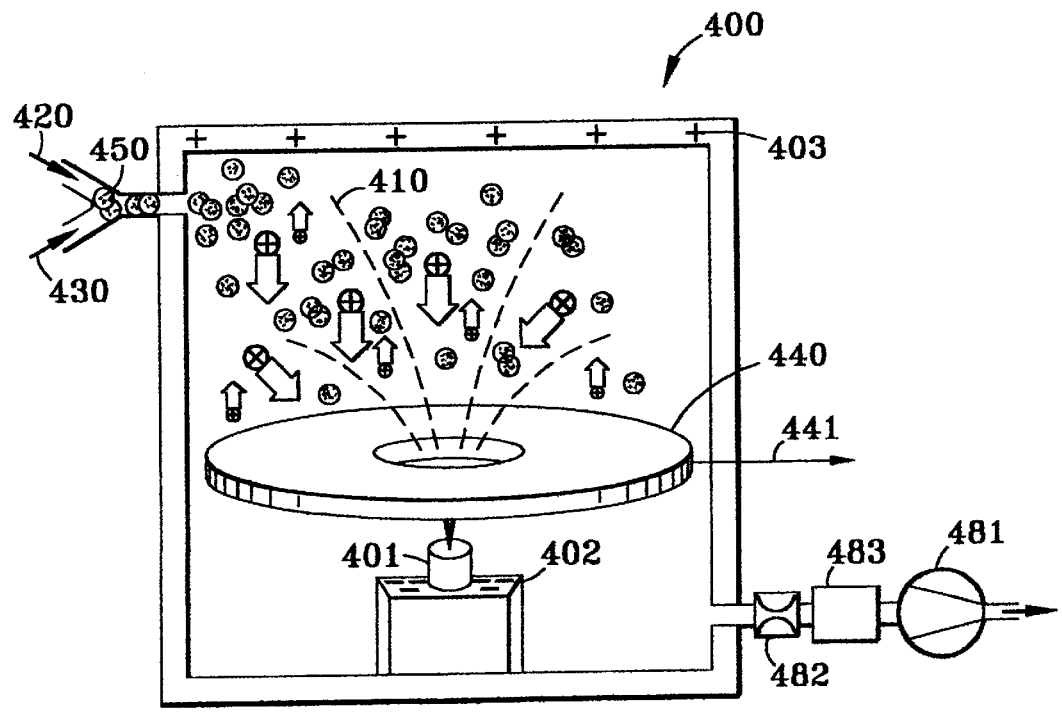
FIG. 4B shows operation of the detection unit when ammonia is present in the gas stream from the ammonia extraction unit.

The gas stream proceeds from the ammonia extraction unit to a detection unit 400 (see FIGS. 4A and 4B). Inside the detection unit, a radioactive source 401 (for example, americium-241) emits alpha particles 410. The alpha particles collide with and ionize gas molecules in the detection unit. Positive ions 412 are attracted to negatively charged electrode 402, while electrons 413 are attracted to positively charged electrode 403. A sensing plate 440 collects the moving charges, thereby generating a current 441 which can be detected by a conventional measurement instrument (not shown).

Detection of ammonia in the gas stream 420 from the extraction unit is accomplished by mixing the gas stream 420 with another gas stream 430 containing HCl vapor, near the entrance of the detection unit 400. When ammonia is not present in the gas stream 420 (FIG. 4A), no reaction between the gases takes place. However, when ammonia extracted from the slurry is present in the gas stream 420, the following reaction occurs upon mixing with the HCl-containing gas stream 430:

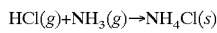

$HCl(g) + NH_3(g) \rightarrow NH_4Cl(s)$

The gaseous ammonia, the concentration of which indicates the endpoint of the film removal process, is thus converted into ammonium chloride 450, which exists as solid particles (see FIG. 4B).

When particles of the $NH_4Cl$ reaction product enter the interior of the detection unit 400, they also become electrically charged by colliding with the alpha particles 410. Some of the electrons recombine with these ionized particles, rather than moving towards the sensing plate 440. The resulting change in the sensing current 441 serves as an indicator of a change in the ammonia concentration in the gas stream 420, and hence in the slurry. Since the ammonia production is correlated to removal of nitride, an indication of the endpoint of the oxide film removal process is thereby provided.

The carrier gases, HCl and $NH_3$ reactants, and reaction products are removed from the detection unit 400 by a pump 481 through a flow restrictor 482. A filter 483 may be used to remove solid particles from the gas stream to avoid damage to the pump.

Figure 5:
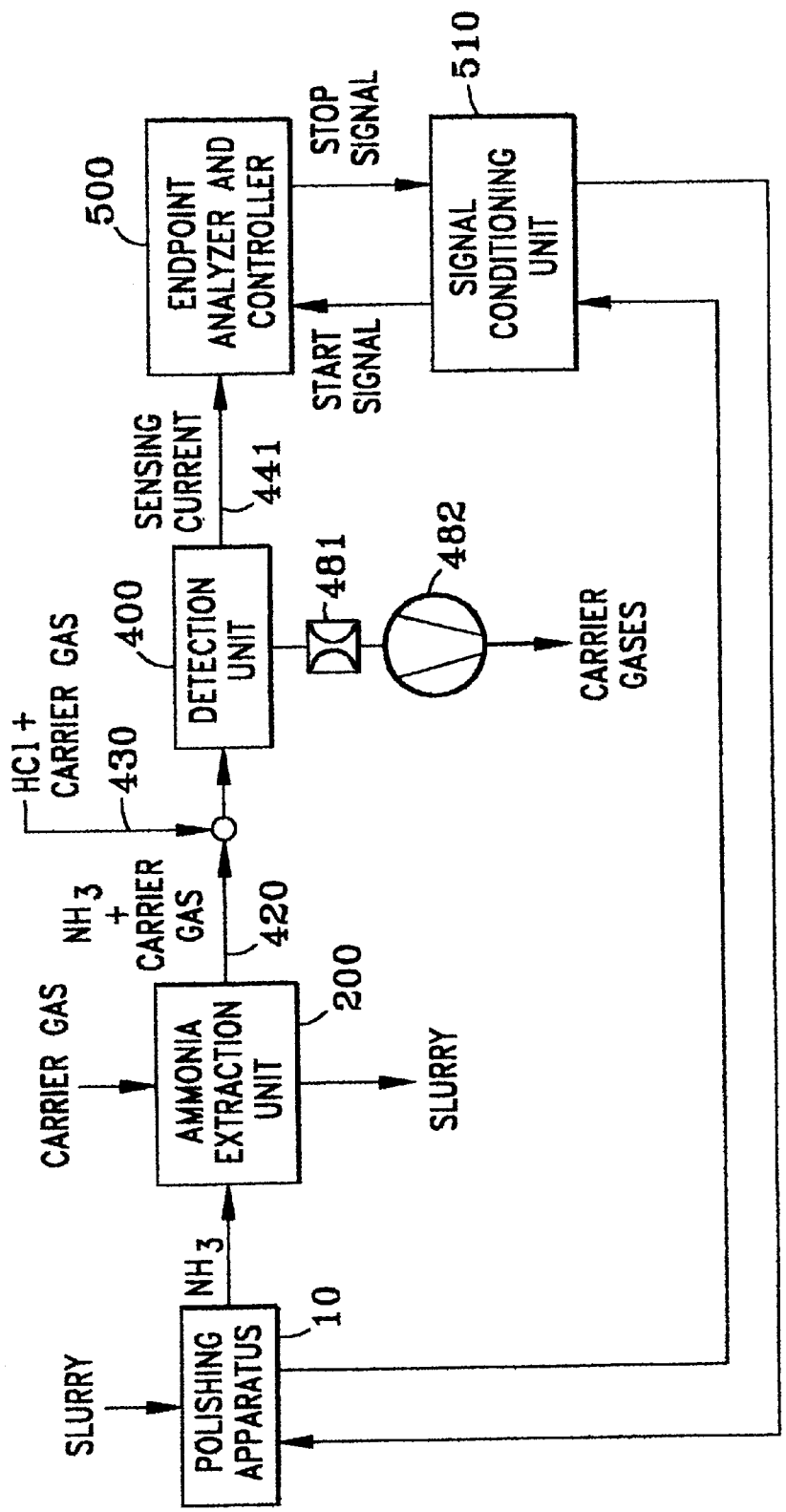
FIG. 5 is a schematic diagram of connections among the polishing apparatus, ammonia extraction unit, detection unit, endpoint analyzer and process control unit.

FIG. 5 is a block diagram showing the various units described above, when used to detect the endpoint of an oxide CMP process with a nitride stopping layer. The endpoint analyzer and controller 500, which accepts as input the sensing current 441 from the detection unit 400, may advantageously include a computer executing a control program to monitor the CMP process and determine the process endpoint. When the endpoint of the CMP process is reached, the computer may send a control signal to the polishing apparatus 10 to terminate the film removal process. The controller 500 also receives a start signal from the polishing apparatus 10, which triggers the program to begin monitoring the endpoint signal automatically. A signal conditioning unit 510 is used to ensure that signals reaching the polishing apparatus 10 and controller 500 are at appropriate voltage levels. The use of an endpoint signal for closed-loop process control has been disclosed elsewhere and need not be discussed in detail here.

In accordance with the present invention, a method and apparatus have been disclosed for highly sensitive ionization-based detection of $NH_4Cl$ particles to provide reliable real-time, in-situ endpoint detection of an oxide film removal process with a nitride stopping layer. The $NH_4Cl$ is a solid phase product of a reaction between gas phase molecules $NH_3$ and HCl. The $NH_3$ is extracted from a silica-water-based slurry by using hydrophobic fibers or a hydrophobic gas-permeable membrane and a very dry, ammonia-free carrier gas. This endpoint detection scheme may advantageously be used in oxide CMP processing for a shallow-trench isolation (STI) structure, or in CMP processing of borophosphosilicate glass (BPSG) or of oxide films with different concentrations of nitride.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for detecting an endpoint of a film removal process in which a target film overlying a stopping film is removed and the stopping film is partially removed, the method comprising the steps of:

generating a chemical reaction product from at least one of the target film and the stopping film, said chemical reaction product having a concentration generated from the target film different from a concentration generated from the stopping film;

converting the chemical reaction product to a separate product;

exposing the separate product to ionizing radiation, the ionizing radiation comprising alpha particles; and monitoring an ionization current generated by the radiation as the target film is removed, wherein a change in the ionization current corresponds to a change in concentration of the separate product, thereby indicating the endpoint of the film removal process.

2. A method according to claim 1, wherein the film removal process comprises dry etching.

3. A method according to claim 1, wherein the film removal process comprises chemical-mechanical polishing.

4. A method according to claim 3, wherein the chemical reaction product is contained in a slurry used in the chemical-mechanical polishing.

5. A method according to claim 4, further comprising the step of extracting the chemical reaction product as a gas from the slurry.

6. A method according to claim 5, wherein said step of extracting further comprises:
   contacting a first side of a hydrophobic structure with the slurry;
   contacting a second side of the hydrophobic structure with a gas stream; and
   allowing the chemical reaction product to pass through the structure as a gas and become entrained in the gas stream.

7. A method according to claim 6, wherein the structure comprises one of a gas-permeable membrane and hollow fibers.

8. A method according to claim 1, further comprising the step of stopping the film removal process when the endpoint has been reached.

9. A method according to claim 1, wherein said converting step further comprises reacting the chemical reaction product with a reactant to produce the separate product.

10. A method for detecting an endpoint of a film removal process in which a target film overlying a stopping film is removed and the stopping film is partially removed, at least one of the target film and the stopping film including a nitride, a concentration of nitride in the target film being different from a concentration of nitride in the stopping film, the method comprising the steps of:
   generating ammonia from the nitride;
   converting the ammonia to a separate product;
   exposing the separate product to ionizing radiation, the ionizing radiation comprising alpha particles; and
   monitoring an ionization current generated by the radiation as the target film is removed,
   wherein a change in the ionization current corresponds to a change in concentration of the ammonia, thereby indicating the endpoint of the film removal process.

11. A method according to claim 10, wherein the separate product is ammonium chloride.

12. A method according to claim 10, wherein the film removal process is chemical-mechanical polishing.

13. A method according to claim 12, wherein the ammonia generated in said generating step is contained in a polishing slurry used in said chemical-mechanical polishing.

14. A method according to claim 13, further comprising the step of extracting the ammonia from the polishing slurry, before said converting step.

15. A method for detecting an endpoint of a film removal process in which a target film overlying a stopping film is removed and the stopping film is partially removed, at least one of the target film and the stopping film including a nitride, a concentration of nitride in the target film being different from a concentration of nitride in the stopping film, the method comprising the steps of:
   generating ammonia from the nitride;
   converting the ammonia to a separate product, the separate product being ammonium chloride;
   exposing the separate product to ionizing radiation; and
   monitoring an ionization current generated by the radiation as the target film is removed,
   wherein a change in the ionization current corresponds to a change in concentration of the ammonia, thereby indicating the endpoint of the film removal process.

16. A method according to claim 15, wherein said ionizing radiation comprises alpha particles.

17. A method according to claim 15, wherein the film removal process is chemical-mechanical polishing.

18. A method according to claim 17, wherein the ammonia generated in said generating step is contained in a polishing slurry used in said chemical-mechanical polishing.

19. A method according to claim 18, further comprising the step of extracting the ammonia from the polishing slurry, before said converting step.

* * * * *